(12) United States Patent
Kim

(10) Patent No.: US 6,656,762 B2
(45) Date of Patent: Dec. 2, 2003

(54) METHOD FOR MANUFACTURING SEMICONDUCTOR IMAGE SENSOR WITH COLOR FILTERS AND BONDING PADS

(75) Inventor: Jaekap Kim, Icheon-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/166,618

(22) Filed: Jun. 12, 2002

(65) Prior Publication Data

US 2003/0176010 A1 Sep. 18, 2003

(30) Foreign Application Priority Data

Mar. 14, 2002 (KR) .................................. 2002-0013804

(51) Int. Cl.[7] .............................................. H01L 21/00
(52) U.S. Cl. ............................. 438/70; 438/69; 438/57
(58) Field of Search .............................. 438/69, 70, 57

(56) References Cited

U.S. PATENT DOCUMENTS 5,286,605 A * 2/1994 Nishioka et al. ............ 430/311
5,747,790 A * 5/1998 Shimomura et al. ...... 250/208.1

* cited by examiner

*Primary Examiner*—Richard Elms
*Assistant Examiner*—Brad Smith
(74) *Attorney, Agent, or Firm*—Jacobson Holman PLLC

(57) ABSTRACT

In a method for fabricating a semiconductor device suitable for an image sensor, a bonding pad is formed on a lower insulating layer after the lower insulating layer is formed on a substrate. Then, an upper insulating layer is formed over the substrate to cover the bonding pad. The upper insulating layer is selectively removed to uncover a top portion of the bonding pad. Subsequently, a protection layer is formed over the substrate. After color filter elements are formed on the protection layer, a planar layer is formed to cover the color filter elements. Finally, microlenses are formed on the planar layer.

3 Claims, 5 Drawing Sheets

METHOD FOR MANUFACTURING SEMICONDUCTOR IMAGE SENSOR WITH COLOR FILTERS AND BONDING PADS

FIELD OF THE INVENTION

The present invention relates to a method for fabricating a semiconductor device; and, more particularly, to a method for fabricating a semiconductor device suitable for an image sensor having microlenses.

BACKGROUND OF THE INVENTION

Recently, most of communications apparatuses are required to process not only voice signals but also image is signals and to that purpose, a color image sensor is generally employed.

The color image sensor usually includes a multiplicity of pixels, each having a metal pattern, color filter elements, and microlenses. The metal pattern has cell electrodes and bonding pads. The color filter elements are formed on a dielectric layer overlying the cell electrodes. The microlenses are positioned over the color filter elements and act to focus incident light onto the color filter elements.

Since a semiconductor device suitable for the image sensor used to be priced high, a fabrication yield thereof could be somewhat disregarded hitherto. However, a recent oversupply of semiconductor devices reduces the high value-added advantage of the image sensor and therefore the fabrication yield becomes an important factor to be seriously taken into account. Whether each of the microlenses has a desired radius of curvature is one of the major factors for achieving a high fabrication yield of the image sensor.

FIGS. 1A to 1I are sectional views illustrating a sequence of conventional processes for fabricating a semiconductor device suitable for an image sensor.

In FIG. 1A, a lower insulating layer 4 is formed on a substrate 2 where a photoelectric conversion element (not shown), such as a charge coupled device (CCD) or a photodiode, and logic circuits (not shown) are arranged. In FIG. 1B, after a metallic material is formed on the lower insulating layer 4, a photolithography is applied thereto, so that a metallic pattern including a bonding pad 6 is formed thereon. Herein, some portions of the lower insulating layer 4 are selectively exposed through the metallic pattern.

In FIG. 1C, a planar upper insulating layer 8 is formed, e.g., by means of a deposition, on the bonding pad 6 and the substrate 2. In FIG. 1D, a first photosensitive material is coated on the upper insulating layer 8 and then selectively removed, so that at least one color filter element 10 is formed thereon. The coating and removing of another first photosensitive material is repeated until a multiplicity of color filter elements 10, e.g., three or four different types, are formed thereon. If three types of color filter elements are present, they may represent red, green, and blue, respectively.

In FIG. 1E, a second photosensitive material is coated on the upper insulating layer 8 and then selectively removed, so that a planar layer 12 is formed to cover the color filter elements 10. In FIG. 1F, a third photosensitive material is coated over the substrate 2 and then selectively removed, so that the third photosensitive material remains on the planar layer 12 only to overlie the color filter elements 10. The third photosensitive material is subsequently heat-treated to form microlenses 14, each of which is desired to have an equal radius of curvature. Each microlens 14 corresponds to one of the color filter elements 10.

In FIG. 1G, a thin oxide layer 16 is formed over the substrate 2 where the microlenses 14 are shaped. Then, as shown in FIG. 1H, a photolithography is applied thereto, so that some portions of the oxide layer 16 and the upper insulating layer 8 are removed to uncover a corresponding portion of the bonding pad 6. The photolithography is the process of transferring patterns of geometric shapes on a mask to a thin layer of photosensitive material called photoresist. Generally, the photolithography includes the steps of coating, exposing, developing, baking, and etching.

The upper insulating layer 8 protects the bonding pad 6 during the process of forming the microlenses 14 or the color filter elements 10. If the bonding pad 6 is exposed to the above-mentioned process, it may be degraded. The degradation of the bonding pad 6 can result in yield loss due to poor wire bonds, or reliability failures in terms of wire bond failures occurring during the lifetime of the image sensor.

While selectively removing the upper insulating layer 8 during the photolithography process, the photosensitive elements such as the microlenses 14, the planar layer 12, and the color filter elements 10 should be protected and the oxide layer 16 is employed for the purpose. The process of forming the oxide layer 16, however, gives rise to a drawback in that the color filter elements 10 or the microlenses 14 may be deformed to thereby reduce the fabrication yield. FIG. 1I shows the microlenses 14 deformed in the process of forming the oxide layer 16.

The color filter elements 10 and the microlenses 14 made of the photosensitive material are usually deformed at a higher temperature than about 200° C. Therefore, to prevent the deformation thereof, the oxide layer 16 should be formed at a lower temperature than about 200° C. At such a relatively low temperature, however, the thickness of the oxide layer 16 tends to become irregular and it is very difficult to minimize the amount of particles produced in the process for forming the oxide layer 16. These drawbacks result in a low yield of the conventional method for fabricating a semiconductor device suitable for an image sensor.

SUMMARY OF THE INVENTION

It is, therefore, an object of the present invention to provide a method for fabricating a semiconductor device suitable for an image sensor, wherein degradation of a bonding pad and deformation of microlenses are avoided during the fabrication process.

In accordance with a preferred embodiment of the invention, there is provided a method for fabricating a semiconductor device suitable for an image sensor, the method including the steps of: forming a lower insulating layer on a substrate; forming a bonding pad on the lower insulating layer; forming an upper insulating layer on the lower insulating layer to cover the bonding pad; selectively removing the upper insulating layer to uncover a top portion of the bonding pad; forming a protection layer on the-upper insulating layer to shield the uncovered portion of the bonding pad; forming a multiplicity of color filter elements on the protection layer; forming a planar layer to cover the color filter elements; and forming a multiplicity of microlenses on the planar layer.

In accordance with another preferred embodiment of the present invention, there is provided a fabricating method for a semiconductor device suitable for an image sensor, the method including the steps of: forming a lower insulating layer on a substrate; forming a bonding pad on the lower insulating layer; forming an upper insulating layer on the lower insulating layer to cover the bonding pad; selectively removing the upper insulating layer to reduce a thickness thereof on the bonding pad; forming a multiplicity of color filter elements on the upper insulating layer; forming a planar layer to cover the color filter elements; selectively removing the upper insulating layer with the reduced thickness to uncover the bonding pad; and forming a multiplicity of microlenses on the planar layer.

In accordance with still another preferred embodiment of the present invention, there is provided a manufacturing method for a semiconductor device suitable for an image sensor, the method including the steps of: forming a lower insulating layer on a substrate; forming a bonding pad on the lower insulating layer; forming an upper insulating layer on the lower insulating layer to cover the bonding pad; selectively removing the upper insulating layer to uncover a top portion of the bonding pad; oxidizing the uncovered portion of the bonding pad to form a metallic oxide layer thereon; forming a multiplicity of color filter elements on the upper insulating layer; forming a planar layer to cover the color filter elements; and forming a multiplicity of microlenses on the planar layer.

BRIEF DESCRIPTION OF THE DRAWINGS

The above and other objects and features of the present invention will become apparent from the following description of a preferred embodiment given in conjunction with the accompanying drawings, in which.

DETAILED DESCRIPTION OF THE PREFERRED EMBODIMENT

Figure 1A:
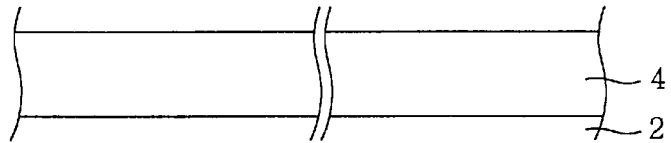
FIGS. 1A to 1I are sectional views illustrating a sequence of conventional processes for fabricating a semiconductor device suitable for an image sensor.
Figure 1B:
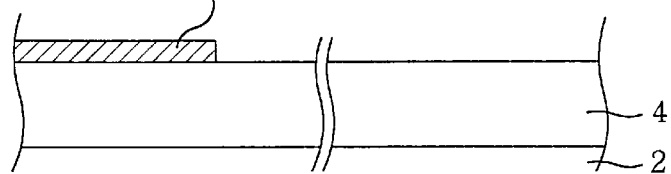
Figure 1C:
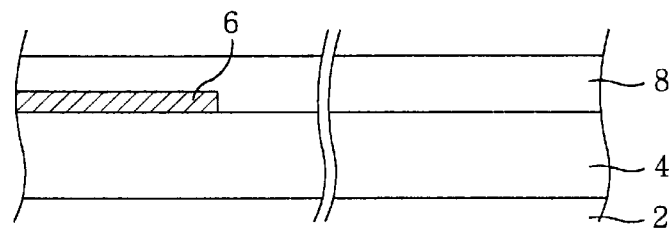
Figure 1D:
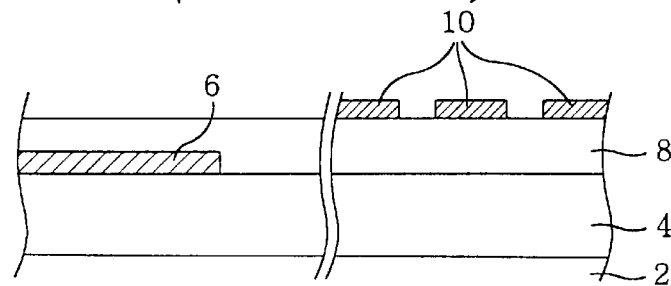
Figure 1E:
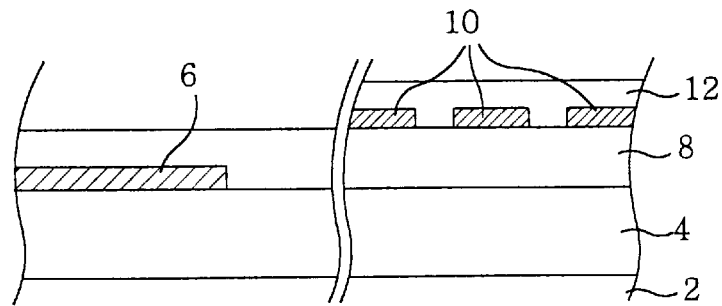
Figure 1F:
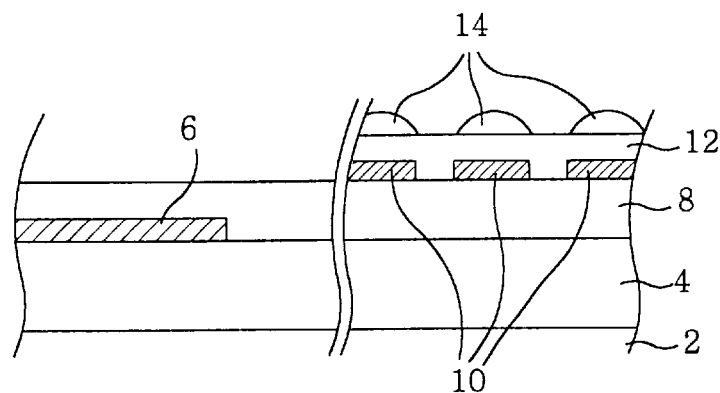
Figure 1G:
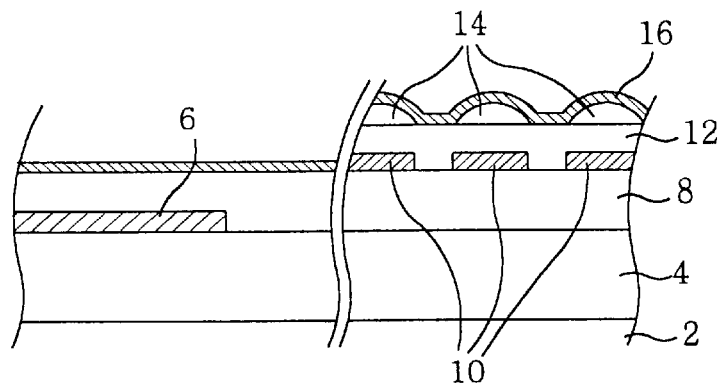
Figure 1H:
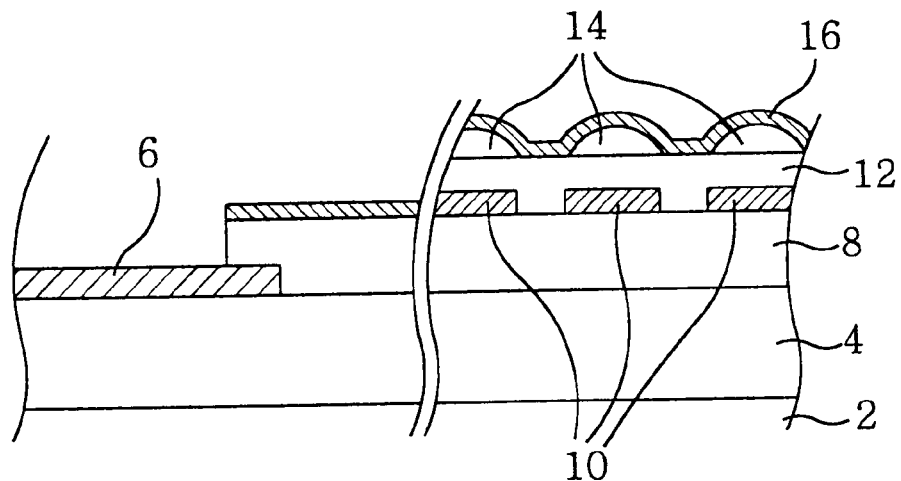
Figure 1I:
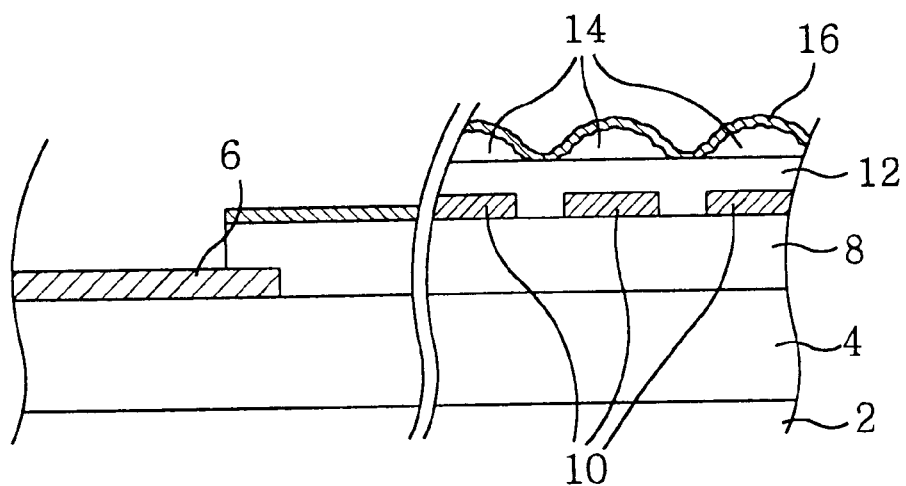

Referring now to FIGS. 2A to 2H, a method for fabricating a semiconductor device suitable for an image sensor in accordance with a preferred embodiment of the present invention will be described in detail. Like numerals represent like parts in the drawings.

In the preferred embodiment of the present invention, after a bonding pad is uncovered, a protection layer is formed to shield the bonding pad and then color filter elements, a planar layer, and microlenses are sequentially formed on the protection layer in that order. Consequently, the microlenses and the color filter elements are not affected in the process forming the protection layer and a high fabrication yield can be achieved.

Figure 2A:
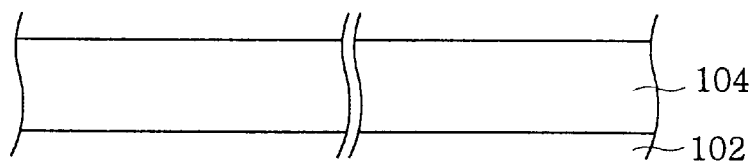
FIGS. 2A to 2H provide sectional views illustrating a sequence of inventive processes for fabricating a semiconductor device suitable for an image sensor in accordance with a preferred embodiment of the present invention.
Figure 2B:
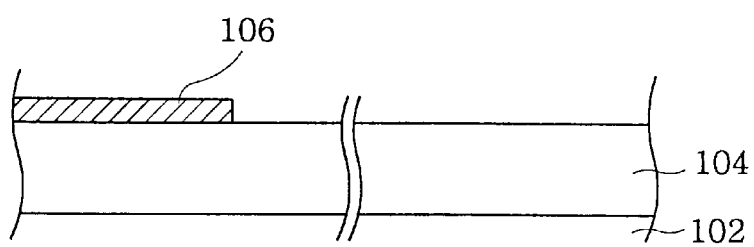

In FIG. 2A, a lower insulating layer 104 is formed on a substrate 102 by means of a deposition. The substrate 102 has a photoelectric conversion element (not shown), such as a charge coupled device (CCD) or a photodiode, and logic circuits (not shown) In FIG. 2B, a metallic material is formed on the lower insulating layer 104 and then a photolithography is applied thereto, so that a metallic pattern including a bonding pad 106 is formed thereon. Herein, some portions, of the lower insulating layer 104 are selectively exposed through the metallic pattern.

Figure 2C:
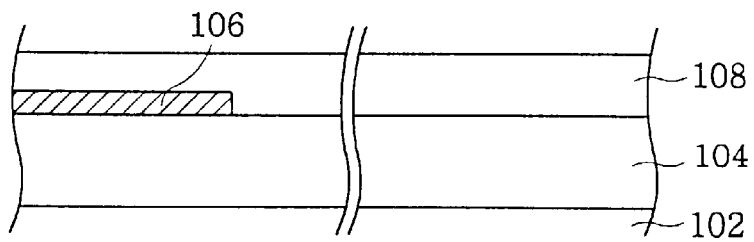
Figure 2D:
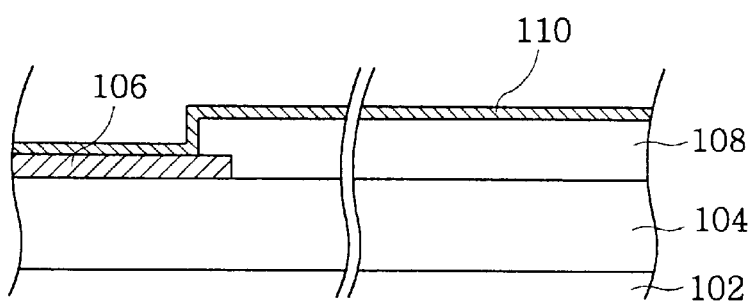

In FIG. 2C, an upper insulating layer 108 is formed and then planarized on the lower insulating layer 104 by means of a deposition to cover the bonding pad 106. In FIG. 2D, after a photolithography is applied to the upper insulating layer 108 to uncover or expose a top portion of the bonding pad 106, a thin protection layer 110 is formed on the upper insulating layer 108 to shield the uncovered or exposed portion thereof. The protection layer 110 is preferably made of oxide, nitride, or oxide-nitride (oxynitride) and preferably has a thickness of 100 to 1000 Å.

The photolithography is the process of transferring patterns of geometric shapes on a mask to a thin layer of photosensitive material called photoresist. Generally, the photolithography includes the steps of coating, exposing, developing, baking, and etching. That is to say, the photolithography includes the steps of: coating a photosensitive material on the upper insulating layer 108; exposing the photosensitive material to light with a photo-mask, developing the photosensitive material; baking the photosensitive material; and etching the upper insulating layer 108 with the baked photosensitive material used as an etching mask.

Figure 2E:
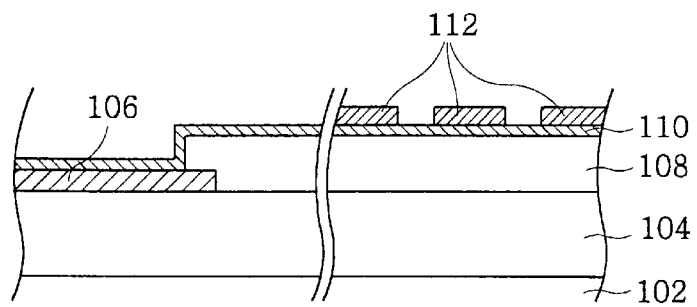

In FIG. 2E, a first photosensitive material is coated on the protection layer 110 and then selectively removed, so that at least one color filter element 112 is formed thereon. The coating and selective removing of another first photosensitive material is repeated until a multiplicity of color filter elements 112, e.g., three or four different color filters, are formed thereon. If there are present three color filters, they may represent red, green, and blue, respectively. Herein, the first photosensitive materials are preferably of a negative photoresist type.

Figure 2F:
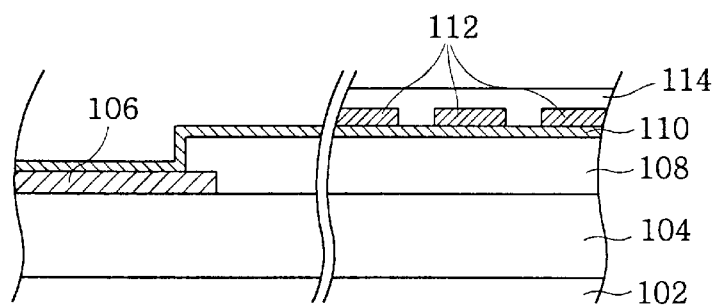
Figure 2G:
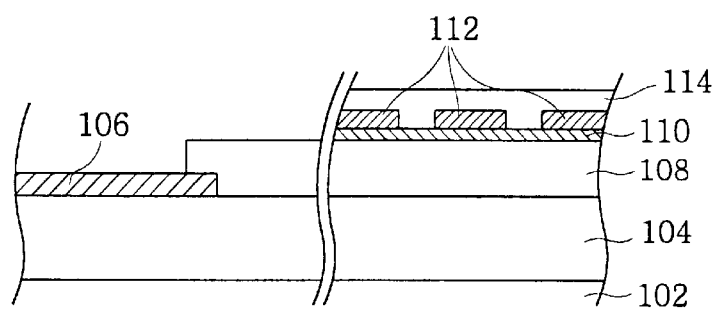

In FIG. 2F, a second photosensitive material is coated on the protection layer 110 and then selectively removed, so that a planar layer 114 is formed to cover the color filter elements 112. The second photosensitive material is preferably of a positive photoresist type. In FIG. 2G, a photolithography is applied to the protection layer 110, so that the protection layer 110 except portions underlying the planar layer 114 is removed on the bonding pad 106 and peripheries thereof.

Figure 2H:
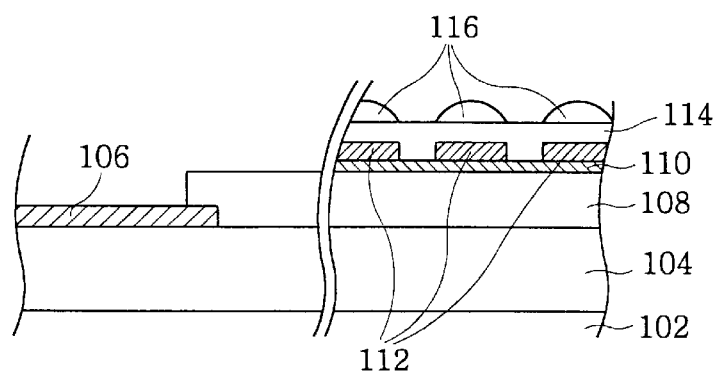

In FIG. 2H, a third photosensitive material is coated over the substrate 102 and then selectively removed, so that the third photosensitive material remains on the planar layer 114 only to overlie the color filter elements 112. Then, the third photosensitive material is heat-treated to form microlenses 116, each having an equal radius of curvature. The third photosensitive material is preferably of a positive photoresist type.

Since the protection layer 110 is formed before the photosensitive materials including the color filter elements 112, the planar layer 114, and the microlenses 116, the protection layer 110 can be formed at a sufficiently high temperature without affecting them. In addition, because the protection layer 110 is removed only after the color filter elements 112 are completed, the bonding pad 106 can be protected during the process of forming the color filter elements 112. Therefore, the fabrication yield of the method in accordance with the preferred embodiment is effectively improved in comparison with that of the conventional method.

For a first modification of the preferred embodiment of the present invention, the protection layer may be selectively removed after the microlenses are completed. The first modification substantially gives the same effects as those of the preferred embodiment of the present invention.

For a second modification, the protection layer may continue to remain on the bonding pad without being removed. In this case, an enhanced probing force can make it possible to apply a probe test to the semiconductor device and, further, enhanced bonding force and temperature can provide a safe wire bonding therefor.

For a third modification, just oxidizing the bonding pad may exclude a process of forming the protection layer. If the bonding pad is oxidized at 200 to 450° C. under a condition of 1 to 10% oxygen content, a metallic oxide layer of about 30 to 120 Å in thickness may be formed on the bonding pad. The metallic oxide layer on the bonding pad can be surely substituted for the protection layer.

For a fourth modification, the upper insulating layer may be reduced in thickness on the bonding pad instead of being completely removed therefrom, such that the fabrication process can be simplified. The thickness-reduced portion of the upper insulating layer can be completely removed to uncover the bonding pad before or after the microlenses are completed. Alternatively, the upper insulating layer may continue to remain thereon yet without being removed.

While the invention has been shown and described with respect to the preferred embodiments, it will be understood by those skilled in the art that various changes and modifications may be made without departing from the spirit and scope of the invention as defined in the following claims.

What is claimed is:

1. A manufacturing method for a semiconductor device suitable for an image sensor, the method comprising the steps of:

forming a lower insulating layer on a substrate;

forming a bonding pad on the lower insulating layer;

forming an upper insulating layer on the lower insulating layer to cover the bonding pad;

selectively removing the upper insulating layer to uncover a top portion of the bonding pad;

oxidizing the uncovered portion of the bonding pad to form a metallic oxide layer thereon;

forming a multiplicity of color filter elements on the upper insulating layer;

forming a planar layer to cover the color filter elements; and forming a multiplicity of microlenses on the planar layer.

2. The method of claim 1, wherein the metallic oxide layer is formed at a temperature of 200 to 450° C. under a condition of 1 to 10% oxygen content.

3. The method of claim 2, wherein the metallic oxide layer has a thickness of about 30 to 120 Å.

* * * * *